(12) United States Patent
Thorn et al.

(10) Patent No.: US 6,710,259 B2
(45) Date of Patent: Mar. 23, 2004

(54) PRINTED WIRING BOARDS AND METHODS FOR MAKING THEM

(75) Inventors: Charles Edwin Thorn, Kenton Hill, KY (US); Frank Polakovic, Manahawkin, NJ (US); Charles A. Mosolf, Juno Beach, FL (US)

(73) Assignee: Electrochemicals, Inc., Maple Plains, NJ (US)

( * ) Notice: Subject to any disclaimer, the term of this patent is extended or adjusted under 35 U.S.C. 154(b) by 0 days.

(21) Appl. No.: 09/954,486

(22) Filed: Sep. 17, 2001

(65) Prior Publication Data

US 2002/0150673 A1 Oct. 17, 2002

Related U.S. Application Data

(63) Continuation-in-part of application No. 09/527,706, filed on Mar. 17, 2000, now Pat. No. 6,303,181, which is a continuation-in-part of application No. 08/975,613, filed on Nov. 21, 1997, now Pat. No. 6,171,468, which is a continuation-in-part of application No. 08/471,871, filed on Jun. 7, 1995, now Pat. No. 5,690,805, which is a continuation-in-part of application No. 08/340,849, filed on Nov. 16, 1994, now abandoned, which is a continuation-in-part of application No. 08/232,574, filed on May 3, 1994, now Pat. No. 5,476,580, which is a continuation-in-part of application No. 08/062,943, filed on May 17, 1993, now Pat. No. 5,389,270.

(51) Int. Cl.[7] .................................................. H05K 1/09
(52) U.S. Cl. ...................... 174/257; 174/262; 174/266; 427/122
(58) Field of Search ................................. 174/257, 262, 174/266; 361/792; 427/122, 96, 97

(56) References Cited

U.S. PATENT DOCUMENTS

| 409,096 A | 8/1889 | Blank |
|---|---|---|
| 1,037,469 A | 9/1912 | Goldberg |
| 2,176,879 A | 10/1939 | Bartell |
| 2,243,429 A | 5/1941 | Laux |

(List continued on next page.)

FOREIGN PATENT DOCUMENTS

| CA | 2102240 | 10/1992 |
|---|---|---|
| CZ | 182408 | 3/1980 |

(List continued on next page.)

OTHER PUBLICATIONS

Acheson—Product Data Sheet "Dag 137 Graphite Lubricating Coating," Acheson Colloids Company, Port Huron, Michigan 48060, 2 pages.

Acheson—Product Data Sheet "Electrodag® Conductive Impregnant," Acheson Colloids Company, Port Huron, Michigan 48060, 2 pages.

(List continued on next page.)

Primary Examiner—Evan Pert
Assistant Examiner—I. B. Patel
(74) Attorney, Agent, or Firm—McAndrews, Held & Malloy, Ltd.

(57) ABSTRACT

A method of applying a conductive carbon coating to a non-conductive surface and a printed wiring board having through holes or other nonconductive surfaces treated with such carbon coatings are disclosed. A conditioning agent is applied to the non-conductive surface to form a conditioned surface. A liquid dispersion of electrically conductive carbon (for example, graphite) having a mean particle size no greater than about 50 microns, combined with an organic binding agent, is coated on the conditioned surface to form an electrically conductive carbon coating. The conductive carbon coating is then optionally fixed on the (formerly) nonconductive surface and dried. The resulting coating has a low electrical resistance and is tenacious enough to be plated and exposed to molten solder without creating voids or losing adhesion, yet is easily removable from copper surfaces of the substrate by microetching.

19 Claims, 1 Drawing Sheet

U.S. PATENT DOCUMENTS

| | | |
|---|---|---|
| 2,692,857 A | 10/1954 | Michel et al. |
| 2,833,736 A | 5/1958 | Glaser |
| 2,872,391 A | 2/1959 | Hauser et al. |
| 2,897,409 A | 7/1959 | Gitto |
| 2,926,116 A | 2/1960 | Keim |
| 2,926,154 A | 2/1960 | Keim |
| 2,978,428 A | 4/1961 | Aberegg |
| 2,983,220 A | 5/1961 | Dalton et al. |
| 3,058,873 A | 3/1962 | Thorn et al. |
| 3,049,469 A | 8/1962 | Davison |
| 3,099,608 A | 7/1963 | Radovsky et al. |
| 3,152,996 A | 10/1964 | Forrester |
| 3,163,588 A | 12/1964 | Shortt et al. |
| 3,224,986 A | 12/1965 | Butler et al. |
| 3,249,559 A | 5/1966 | Gallas |
| 3,332,834 A | 7/1967 | Reynolds, Jr. |
| 3,495,962 A | 2/1970 | Norton |
| 3,506,482 A | 4/1970 | Hirohata et al. |
| 3,509,088 A | 4/1970 | Dalton |
| 3,515,201 A | 6/1970 | Zimmerman |
| 3,518,116 A | 6/1970 | Stock et al. |
| 3,565,658 A | 2/1971 | Frazier et al. |
| 3,578,577 A | 5/1971 | Gilchrist |
| 3,592,731 A | 7/1971 | Griggs |
| 3,639,121 A | 2/1972 | York |
| 3,655,530 A | 4/1972 | Taylor |
| 3,658,873 A | 4/1972 | Kelm et al. |
| 3,696,054 A | 10/1972 | Saunders |
| 3,697,450 A | 10/1972 | Takenaka et al. |
| 3,725,214 A | 4/1973 | Bride |
| 3,763,060 A | 10/1973 | Hamerstrand et al. |
| 3,764,280 A | 10/1973 | Lupinski |
| 3,818,412 A | 6/1974 | Deardurff |
| 3,852,131 A | 12/1974 | Houston |
| 3,865,626 A | 2/1975 | Diener et al. |
| 3,865,699 A | 2/1975 | Luch |
| 3,870,987 A | 3/1975 | Wiley et al. |
| 3,874,862 A | 4/1975 | Bickling, Jr. et al. |
| 3,881,048 A | 4/1975 | Bertrand |
| 3,917,894 A | 11/1975 | Coleman |
| 3,962,159 A | 6/1976 | Ray-Chaudhuri et al. |
| 3,963,498 A | 6/1976 | Trevoy |
| 3,966,581 A | 6/1976 | Holte |
| 3,983,042 A | 9/1976 | Jain et al. |
| 3,991,397 A | 11/1976 | King |
| 4,000,046 A | 12/1976 | Weaver |
| 4,035,265 A | 7/1977 | Saunders |
| 4,037,017 A | 7/1977 | Maslanka |
| 4,090,984 A | 5/1978 | Lin et al. |
| 4,104,178 A | 8/1978 | Jain et al. |
| 4,105,513 A | 8/1978 | Nishino et al. |
| 4,152,199 A | 5/1979 | Hamerstrand et al. |
| 4,187,334 A | 2/1980 | LaBate |
| 4,205,974 A | 6/1980 | Franz |
| 4,213,870 A | 7/1980 | Loran |
| 4,239,794 A | 12/1980 | Allard |
| 4,239,818 A | 12/1980 | LaBate |
| 4,254,180 A | 3/1981 | Kline |
| 4,278,511 A | 7/1981 | Dugan |
| 4,316,831 A | 2/1982 | LaBate |
| 4,321,295 A | 3/1982 | Smith-Johannsen |
| 4,368,252 A | 1/1983 | Kakuhashi et al. |
| 4,389,278 A | 6/1983 | Kai |
| 4,401,579 A | 8/1983 | Kratzer |
| 4,416,790 A | 11/1983 | Schürmann et al. |
| 4,424,930 A | 1/1984 | Wilhelmson |
| 4,425,380 A | 1/1984 | Nuzzi et al. |
| 4,430,166 A | 2/1984 | Carter |
| 4,442,139 A | 4/1984 | Brigham |
| 4,462,922 A | 7/1984 | Boskamp |
| 4,465,565 A | 8/1984 | Zanio |
| 4,478,368 A | 10/1984 | Yie |
| 4,529,683 A | 7/1985 | Bishop |
| 4,547,311 A | 10/1985 | Sako et al. |
| 4,571,286 A | 2/1986 | Penato |
| 4,581,301 A | 4/1986 | Michaelson |
| 4,617,579 A | 10/1986 | Sachdev et al. |
| 4,619,741 A | 10/1986 | Minten et al. |
| 4,619,871 A | 10/1986 | Takami |
| 4,622,107 A | 11/1986 | Piano |
| 4,622,108 A | 11/1986 | Polakovic et al. |
| 4,629,537 A | 12/1986 | Hsu |
| 4,631,117 A | 12/1986 | Minten et al. |
| 4,634,619 A | 1/1987 | Lindsay |
| 4,683,036 A | 7/1987 | Morrissey et al. |
| 4,684,560 A | 8/1987 | Minten et al. |
| 4,691,091 A | 9/1987 | Lyons et al. |
| 4,718,993 A * | 1/1988 | Cupta et al. ................ 361/748 |
| 4,724,005 A | 2/1988 | Minten et al. |
| 4,735,676 A | 4/1988 | Iwasa |
| 4,735,734 A | 4/1988 | Staub et al. |
| 4,758,358 A | 7/1988 | Lum et al. |
| 4,786,198 A | 11/1988 | Zgambo |
| 4,790,902 A | 12/1988 | Wada et al. |
| 4,808,324 A | 2/1989 | Periard et al. |
| 4,818,437 A | 4/1989 | Wiley |
| 4,818,438 A | 4/1989 | Wiley |
| 4,820,344 A | 4/1989 | Geke et al. |
| 4,867,792 A | 9/1989 | Ronlan |
| 4,874,477 A | 10/1989 | Pendleton |
| 4,879,015 A | 11/1989 | Adamek et al. |
| 4,889,750 A | 12/1989 | Wiley |
| 4,897,164 A | 1/1990 | Piano et al. |
| 4,911,796 A | 3/1990 | Reed |
| 4,921,777 A | 5/1990 | Fraenkel et al. |
| 4,935,109 A | 6/1990 | Dugan |
| 4,964,948 A | 10/1990 | Reed |
| 4,964,959 A | 10/1990 | Nelson et al. |
| 4,969,979 A | 11/1990 | Appelt et al. |
| 4,980,202 A | 12/1990 | Brennan et al. |
| 4,994,153 A | 2/1991 | Piano et al. |
| 5,015,339 A | 5/1991 | Pendleton |
| 5,018,979 A | 5/1991 | Gilano et al. |
| 5,024,735 A | 6/1991 | Kadija |
| 5,030,367 A | 7/1991 | Tanaka et al. |
| 5,032,235 A | 7/1991 | Downing et al. |
| 5,041,242 A | 8/1991 | Fowle et al. |
| 5,057,245 A | 10/1991 | Frentzel et al. |
| 5,106,537 A | 4/1992 | Nelsen et al. |
| 5,108,553 A | 4/1992 | Foster et al. |
| 5,110,355 A | 5/1992 | Penleton |
| 5,139,642 A | 8/1992 | Randolph et al. |
| 5,160,375 A | 11/1992 | Otaki |
| 5,234,627 A | 8/1993 | Damschroder |
| 5,262,041 A | 11/1993 | Gulla |
| 5,277,787 A | 1/1994 | Otani et al. |
| 5,389,270 A | 2/1995 | Thorn et al. |
| 5,391,421 A | 2/1995 | Gulla |
| 5,468,597 A | 11/1995 | Calabrese et al. |
| 5,476,580 A | 12/1995 | Thorn et al. |
| 5,484,518 A | 1/1996 | Goldberg |
| 5,494,610 A | 2/1996 | Lovell |
| 5,498,372 A | 3/1996 | Hedges |
| 5,500,106 A | 3/1996 | Goldberg |
| 5,536,386 A | 7/1996 | Ferrier et al. |
| 5,547,558 A | 8/1996 | Sakamoto et al. |
| 5,549,849 A | 8/1996 | Namura et al. |
| 5,622,652 A | 4/1997 | Kucherovsky et al. |
| 5,690,805 A | 11/1997 | Thorn et al. |
| 5,725,807 A | 3/1998 | Thorn et al. |

| | | | |
|---|---|---|---|
| 5,738,776 A | * | 4/1998 | Florio et al. ............... 205/118 |
| 5,858,198 A | * | 1/1999 | Florio et al. ............... 205/183 |

FOREIGN PATENT DOCUMENTS

| | | |
|---|---|---|
| EP | 0 085 413 A2 | 8/1983 |
| EP | 0 381 761 A1 | 8/1990 |
| EP | 0 752 807 A1 | 1/1997 |
| EP | 0 759 482 A1 | 2/1997 |
| GB | 1136977 | 12/1968 |
| GB | 1176597 | 1/1970 |
| GB | 1506464 | 4/1978 |
| GB | 2177707 A | 1/1987 |
| JP | 60-110893 | 11/1983 |
| SU | 571435 | 9/1977 |
| SU | 674981 | 7/1979 |
| SU | 745964 | 7/1980 |
| SU | 768793 | 11/1980 |
| SU | 943333 | 7/1982 |
| WO | WO 92/19092 | 10/1992 |

OTHER PUBLICATIONS

Acheson—"Electrodag®Coatings Selection Guide," Acheson Colloids Company, P.O. Box 611747, Port Huron, Michigan 48061–1747.

Acheson—Product Data Sheet "Aquadag,".

Aqualon, CMC Aqualon Cellulose Gum Sodium Carboxymethycellulose, Physical and Chemical Properties, 5 pages.

Aqualon, Klucel Hydroxypropylcellulose, Physical and Chemical Properties, 28 pages.

Aqualon, Natrosol Hydroxyethylcellulose A Nonionic Water–Soluble Polymer Physical and Chemical Properties, Aqualon pp. 1–5.

Aqualon, Technical Information "Freezer Gel Preparation With Aqualon™ CMC," Bulletin VC–521 (Supersedes VC–405D), Aqualon Company, 1313 North Market Street, Wilmington, Delaware 19894, 2 pages.

Aquaness Chemical Technical Information, "Arklear 155" 1 page.

Aquaness Chemical Technical Information, "Arklear 1055" 1 page.

Asakawa, et al., "Adsorption of Phenol on Surface–modified Carbon Black from its Aqueous Solution, II, Influence of Surface–Chemical Structure of Carbon on Adsorption of Phenol," *Bull. Chem. Soc. Jpn.* 58:2009–2014 (1985).

Bernhardt, "Preparation of Suspensions for Particle Size Analysis Methodical Recommendations, Liquids and Dispersing Agents," *Advances in Colloid and Interface Science*, 29:79–139 (1988).

Bose, et al., "Preparation, Voltammetric Characterization, and Use of a Composite Containing Chemically Synthesized Polypyrrole and a Carrier Polymer," *J. Electrochem, Soc.*, 139(9):L75–L76 (Sep. 1992).

Brédas, "Electronic Structure of Highly Conducting Polymers," Facultés Universitaires Notre–Dame de la Paix, Namur, Belgium, 25:859–912.

Chaurasia, et al., "Thermal Conductivity of Supension and Emulsion Materials," *J. Appl. Chem. Biotechnol.*, 25(12):881–890 (1975).

Comello, "R&D Semiconductor Research, Conducting Polymers Finding Niche Uses," *R&D* Magazine, pp. 63–64 (Jul. 1993).

Dagani, "Organic Metals: New polymers are most metallic yet," News of the Week, C&EN, pp. 8–9 (Aug. 31, 1992).

Daxad, High Activity Dispersants, Technical Data CP–2, Organic Chemicals Division, W.R. Grace & Co., Lexington, Mass. 02173, 1 page.

Dean, Lange's Handbook of Chemistry, McGraw–Hill, Inc., 14$^{th}$ ed., pp. 8.103–8.107 (Month of publication is unknown.)

Dow Chemical Company, Methocel Cellulose Ethers, Binders and processing aids for ceramics, 4 pages.

Dow Chemical Co., Selecting the Best Versene Chelating Agent, (undated).

Dovgyalo, et al., "Electric mass transfer of dispersed conducting carbon black–polyethylene compositions during electrostatic fluidized–bed deposition," *Inzh.–Fiz. Zh.* 57(4):639–44 (1989) Abstract No. C A112(16):141269 (Abstract Only).

Encyclopedia of Science and Engineering, Cellular Materials to Composites, John Wiley & Sons, vol. 3, pp.235–243. (Month not known.)

Exxon Chemical, Callaway 6818, 2 pages (May. 30, 1991).

Fluorad™Technical Information—Fluorochemical Surfactants FC–120, 3M Industrial Chemical Products Division, (Mar. 1992).

Gottesfeld, et al., "The Application of a Polypyrrole Precoat for the Metallization of Printed Circuit Boards," *J. Electrochem. Soc.*, 139(1):L14–L16 (Jan. 1992).

Grafo Bulletin, Dispersions of Graphite and Other Solids for Industrial Coating Applications, Grafo Coatings for the Electronic Industry (undated).

Grafo Bulletin, Dispersions of Graphite and Other Solids for Industrial Coating Application, Products for Electronics (undated).

Groszek et al., "Heats of Adsorption of Gold Chloride and Cyanide Complexes from Aqueous Solutions on Graphitized Carbon Black and a Coconut Active Carbon," *Carbon*, 29(7):821–829 (1991).

Hercules, Chemical and Physical Properties of Hercules Ethylcellulsoe, A Specialty Polymer With Broad Stability and Compatibility. Undated.

Hercules, Product Data, "Kymene® 736 Wet–Strength Resin and Retention Aid," Number 7576–1, (Supersedes 7576) Hercules Incorporated, Hercules Plaza, 1313 North Market Street, Wilmington, DE 19894–0001.

Hercules, Hercules, Nitrocellulose, The First Thermoplastic Polymer Made From a Renewable Resource, Chemical and Physical Properties, Undated.

Hercules Technical Information, "Polycup® Resins Crosslinking Agents for Latices and Water–Soluble Polymers," Bulletin NP–102A (Supersedes NP–102) pp. 1–4 Hercules Incorporated Hercules Plaza, Wilmington, DE 19894–0001.

Huang, et al., "Application of Conducting Polyaniline to the Electrolytic Plating Process," *ANTEC* pp. 864–867 (1991).

Hycar, High Performance Emulsions, Technical Data HYCAR 26120 (8703) 0009n–27–30.

Hycar—Material Safety Data Sheet Hycar Acrylic Latex, Doc. 85134, Issued Jan., 1987 (Revised May 3, 1991), BF Goodrich Specialty Chemicals, 9911 Brecksville Road, Cleveland, Ohio 44141–3247.

Jara, et al., "Separation of carbon black from aqueous suspensions," Abstract No. 91:96226f, 60–*Sewage, Wastes* 91:299 (1979).

JP Kokai No. 49–36429, Apr. 4, 1974.

JP Kokai No. 52–87694, Jul. 21, 1977.

JP Kokai No. 58–138795, Aug. 17, 1983.

JP Kokai No. 59–223769 Dec. 15, 1984.
JP Kokai No. 60–155280, Aug. 15, 1985.
JP Kokai No. 61–51097, Mar. 13, 1986.
JP Kokai No. 63–125580, May 28, 1988.
JP Kokai No. 1–219170, Sep. 1, 1989.
JP Kokai No. 2–151682, Jun. 11, 1990.
JP Kokai No. 2–258897, Oct. 19, 1990.
JP Kokai No. Hei 2–258897, Oct. 19, 1990.
JP Kokai No. Hei 3–207890, Sep. 11, 1991.
JP Kokai No. Hei 4–332774, Nov. 19, 1992.
Karmazina, et al. "Studies of Graphitized Black After Contact with Aqueous Solution of Surfactant by the Method of Slow Neutron Scattering," Chemistry and Technology of Water, 1991 T. 13, No. 8 pp. 678–681. (No Translation) (Abstract only translated).
Kelco, Technical Bulletin DB—15, Kelzan Xanthan Gum, 3 pages (1991).
Kirk Othmer, vol. 1 pp. 298–301, 312–313, 330–333, 386–388, 394–396, 427,430.
Kirk Othmer, vol. 4, pp. 535–555.
Kirk Othmer, vol. 4, pp. 556–558.
Kirk Othmer, vol. 4, pp. 631–636.
Kirk–Othmer, Encyclopedia of Chemical Technology, $4^{th}$ ed., vol. 4, 974–976, 1002–1003, 1063–1067, 1115.
Kirk–Othmer, vol. 9, pp. 61–88.
Kirk Othmer, vol. 9, pp. 267–272, 274–280, 286 288.
Kirk Othmer, vol. 20, pp. 197–198, 200–201, 207–227.
Leeuw, et al., "Electroplating of conductive polymers for the metallization of insulators," *Synthetic Metals* 66:263–273 (1994).
Metal Lab. Grafo 1204B Interim Data Sheet (undated).
Moraru et al., Adsorption of oxyethylated nonionic surfactants and its effect on the stabiliy of aqueous dispersions of graphite, Abstract No. 102:084887e, 66–*Surface Chem, Colloids*, 102:397 (1985).
Moraru, et al., "Adsorption of Oxy-Ethylated Nonionic Surfactants and its Influence on the Stabiliy of the Aqueous Dispersion of Grphite," 7 *Colloid Journal*, 6:1148–1153, (abstract only translated).
Nakahara, "Additive Plating," Printed Circuits Handbook, Chapter 13, pp. 13.1–13.17.
Olin Hunt Specialty Products Inc. Operating Bulletin Rev. 1 (Jul. 1991), Olin Hunt, Blackhole Conveyor System Process II, pp. 1–27.
Olin Hunt Specialty Products Inc., Operating Bulletin Rev. 1 (Jul. 1991), Olin Hunt, Blackhole Vertical Process, pp. 26.
Polytec Incorporated , Product Data, "Polytec Cationic Polymers," Polytec Incorporated, PO Box 1247, Gulf Shores, Alabama 36547, 2 pages.
Rohm and Haas, Rohm and Haass Products for the Graphic Arts Industry, ACRYSOL I–1955, Rohm and Haas Company, 2 pages (1988).
Rohm and Haas, Rohm and Haas, Rohm and Haas Products for the Graphic Arts Industry, ACRYSOL I–545, 3 pages (Undated).
Sandoz Chemicals, Water Soluble Polymers, 2 pages (undated).
Sandu, et al., "Water–colloidal Graphite disperse systems. I. Description of the components,"*Rev. Chim. (Bucharest)*, 37(11):968–74 (1986) (Abstract Only).
Shestakova et al., Effect of the salt composition of process water on pH of aqueous carbon black suspensions, Abstract No. 9722a, 61—*Water*, 79:307 (1973).

Takashina et al., "Carbon black composition dispersible in water," Abstract No. 138303p. *Chemical Abstracts*, 79:60 (1973).
Van Deraerschot, "Separation of carbon black from aqueous suspensions," Abstract No. 91:76784h, *Chemical abstracts*, 91:134 (1979).
Zhou, et al., "Unique Optical and Electrochemical Properties of π–Conjugated Electrically Conducting Copolymers Consisting of Electron–withdrawing Pyridine Units and Electron–donating Thiophene Units," *J. Chem. Soc. Chem. Commun*, 17:1210–1212 (1991).
Kadlec, et al. "Technical–grade carbon black from aqueous dispersions and carbon–containing heterogeneous mixtures," 188311 B—Jun. 15, 1981 Czech, Abstract Only.
Necesany, et al., "Recovery of solid carbon from aqueous dispersion," 206687 B—Sep. 15, 1983 Czech, Abstract Only.
Juracka, et al., "Compositions for formation of electrically conductive or semiconductive coatings," 259192 B1—Mar. 31, 1989 Czech, Abstract Only.
Bauer, et al. 294589—Oct. 2, 1991 DD, Abstract Only.
Chiyoda, et al., "Coating composition based on graphite for the interior wall of a picture tube," 3,008,495—Apr. 9, 1989 Germany, Abstract Only.
02/153811—00/00/90 Japan, Abstract Only.
76–005856—Feb. 23, 1976 Japan, Abstract Only.
Shibata, "Electrically *conductive* coating compositions for coating the inside of cathode ray tubes," 51067992—Jun. 12, 1976 Japan, Abstract Only.
Yoshimura, et al., "Electrically Conductive Coating Composition," 58–025368—Feb. 15, 1983 Japan, Abstract Only.
Sako, et al., "Electrically Conductive Paint Composition," 58–132058—Aug. 6, 1983 Japan, Abstract Only.
Showa, "Water–resistant *electroconductive* paint," 58–194962—Nov. 14, 1983 Japan, Abstract Only.
Showa, "Coating Materials for metal melt–casting molds," 59–232648—A2 Dec. 27, 1984 Japan, Abstract Only.
Ozaki, et al., "Conductive Water–Disperse Coating," 60–156769—Aug. 16, 1985 Japan, Abstract Only.
Masakazu, et al., "Production of Electrically–Connductive Graphite Material," 61–127612—Jun. 14, 1986 Japan, Abstract Only.
Hisashi, "Formation of Conductive Coated Film," 61–161181—Jul. 21, 1986 Japan, Abstract Only.
"Hair dyeing agent—contg. E.g. triphenylmethane agent and/or azo agent and/or quinoline agent and carbon black," 1242518—Sep. 27, 1989 Japan, Abstract Only.
"Lubricant compsn. For high temps.—contains powdered graphite, water, and as binder, water–soluble polymer and water–dispersible polymer," 2051592—Jan. 21, 1990 Japan, Abstract Only.
Tada, et al., "Antifriction, abrasion–resistant electrophoretic coating compositions,"05117556—May 14, 1993 Japan., Abstract Only.
Tatsuzono, et al., "Manufacture of electrically *conductive* coating materials for Braun tubes," 06240182—Aug. 30, 1994 Japan, Abstract Only.
Ryzhkov, et al., "Parting Coating," 414039—Feb. 5, 1974 USSR, Abstract Only.
Medrikov, et al., "Aqueous carbon black dispersion," 768793—Oct. 7, 1980—USSR, Abstract Only.

Akhremenko et al., "Lubricant for roller–less conveyor belt moving in groove—contains graphite, foaming agent, and additional alkali salts of higher fatty acids, to stabilise lubricating properties," 1498786—Aug. 7, 1989 USSR, Abstract Only.

Sokirko, et al., "Lubricant for hot pressure forming of metals—contains graphite, fireclay, additional synthetic detergent, and water," 1579929—Jul. 23, 1990—USSR, Abstract Only.

Chiyoda, et al., "Coating composition based on graphite for the interior wall of a picture tube," 3008495—Apr. 9, 1981—DE, Abstract Only.

Borden, "Durite" Phenolic Resin, AL–5801A, Borden Packaging and Industrial Products, 2/91.

Graden Chemical Company, Inc., "Densefloc 30, Polymetric Flocculating Agent for Water Treatment," (Undated).

IPC–QE–605, pp. 6–7, 9–10, –12–25, 27, 29, 32, 35–36, 40, 52, 61, 70 (Oct. 1985).

Carano et al., The Use of Direct Metalization in the Production of Laser and Plasma Drilled Microvias for BGA Applications, *Circuitree* 6 pages (Feb. 1998.

Carano, et al., "The Use of a Chemical Fixing Agent with Colloidal Graphite for Producing High Reliability through Vias and Microvias," 10 pages, Electrochemicals, Maple Plain, MN (date unknown).

Paulus, et al., "Integrating High Density Interconnect Microvia Technology into the Multilayer board Mainstream," *Circuitree*, pages 6 (Oct. 1998).

Young, et al., Thermal Reliability of High Density Interconnects Utilizing Microvias and Standard Through–Hole Technologies, 9 pages (date unknown).

Howie, et al., Blowholing on PTH Solder Fillets, Part 2, The Nature, Origin and Evolution of the Gas, *Circuit World*, vol. 12(4):(1986).

Carano, et al. Chemical Fixing Agent with Colloidal graphite for Producing High Reliability Throughvias and Microvias, Circuitree, pp. 120–126. Jul. 1999).

\* cited by examiner

PRINTED WIRING BOARDS AND METHODS FOR MAKING THEM

CROSS-REFERENCE TO RELATED APPLICATIONS

This specification is a continuation-in-part of (1) U.S. Ser. No. 09/527,706, filed Mar. 17, 2000, now U.S. Pat. No. 6,303,181, which is a continuation-in-part of (2) U.S. Ser. No. 08/975,613, filed Nov. 21, 1997, now U.S. Pat. No. 6,171,468, which is a continuation-in-part of (3) U.S. Ser. No. 08/471,871, filed Jun. 7, 1995, now U.S. Pat. No. 5,690,805, which is a continuation-in-part of (4) U.S. Ser. No. 08/340,849, filed Nov. 16, 1994, now abandoned, which is a continuation-in-part of (5) U.S. Ser. No. 08/232,574, filed May 3, 1994, now U.S. Pat. No. 5,476,580, which in turn is a continuation-in-part of (6) U.S. Ser. No. 08/062,943, filed May 17, 1993, now U.S. Pat. No. 5,389,270. Other related applications are U.S. Ser. No. 08/477,452, filed Jun. 7, 1995, now abandoned, and U.S. Ser. No. 08/486,331, filed Jun. 7, 1995, now U.S. Pat. No. 5,725,807. The entire specification and all the claims of each prior patent application and patent referred to above are hereby incorporated by reference to provide continuity of disclosure.

STATEMENT REGARDING FEDERALLY SPONSORED RESEARCH OR DEVELOPMENT

Not applicable.

BACKGROUND OF THE INVENTION

The present invention is directed to printed wiring boards having recesses, or other non-conductive surfaces, made electrically conductive by applying a coating containing carbon, preferably graphite, to an initially nonconductive through hole or other surface.

The prior art, for example U.S. Pat. No. 3,224,986, discloses water-insoluble, water-insensitive polymers made by (1) forming a polyamide, (2) reacting the polyamide with epichlorohydrin to make a cationic, water-soluble, thermosetting resin; and (3) reacting the resin with a water-soluble polymer, such as carboxymethylcellulose or others, in water at a low pH. Related disclosure may be found in U.S. Pat. Nos. 3,658,873; 3,049,469; 3,962,159; 3,917,894; 4,037,017; 4,152,199; 2,926,116; 2,926,154; 3,332,834; 3,592,731; and 3,763,060. All the patents listed in this paragraph are hereby incorporated by reference. These patents assert that various polysaccharides, such as starches and carboxymethylcellulose, react with polyamide-epichlorohydrin resins to form water-resistant coatings.

Additional background information about conductive coatings for through holes may be found in U.S. Pat. No. 5,690,805. That patent is hereby incorporated by reference in the present disclosure.

SUMMARY OF THE INVENTION

One aspect of the present invention is a method of applying an electrically conductive carbon coating to a non-conductive surface.

A substrate is provided having at least one non-conductive surface. An example of such a substrate is the wall of a through hole or via drilled or otherwise formed in the non-conductive substrate for a printed wiring board.

A conditioning agent is provided. The preferred conditioning agent contains a substantive cationic conditioner, for example, a polyamide, more preferably a polyamide epichlorohydrin resin in one embodiment of the invention.

A liquid dispersion of electrically conductive carbon including a water-dispersible binding agent is also provided. The carbon dispersion has a mean particle size no greater than about 50 microns. The carbon particles in the dispersion preferably have a mean particle size of not greater than about 1 micron, particularly for a graphite coating.

The nonconductive surface to be made electrically conductive is first contacted with the conditioning agent to apply a film of a cationic substantive conditioner on the nonconductive surface. The carbon dispersion is applied to the conditioned surface in an amount and under conditions effective to form a substantially continuous, electrically conductive carbon coating.

Next, the conductive carbon coating is fixed on the (formerly) nonconductive surface by applying an aqueous acid. ("Fixing" is defined below in the detailed description.) Typically, fixing is carried out after the carbon dispersion is applied, without drying the carbon coating first. The fixing process removes excessive carbon composition deposits, and thus smooths the carbon coating on the recess surfaces by eliminating lumps and by making the coating more uniform and adherent.

As used herein, a "uniform" coating is one essentially free of excess conductive coating composition build-up, particularly at the opening or openings of a recess, so the coating has a substantially uniform thickness at the mouth and in the interior of the recess, as viewed under a 50× magnification of a cross-section of a recess after plating. Graphite and carbon black are referred to in this specification either together or separately as "carbon." A non-conductive surface can be any surface that does not conduct electricity to the necessary or desired degree for some practical application.

Another aspect of the invention is a printed wiring board. The printed wiring board includes at least two conductive circuit layers separated by nonconductive material. At least one recess in the nonconductive material has a nonconductive surface intersecting at least two of the conductive circuit layers.

An electrically conductive coating is provided on the nonconductive surface. This coating includes electrically conductive carbon having a mean particle size not greater than about 1 micron and a water-dispersible organic binding agent. The coating is electrically conductive, allowing electrical current to flow between the two conductive circuit layers. The conductive carbon coating can optionally be electroplated to provide a surface at least substantially free of visible voids. The electroplated surface can optionally be soldered to form electrical connections between the conductive circuit layers and the leads of electrical components, which is the typical construction of a complete printed wiring board.

DETAILED DESCRIPTION OF THE INVENTION

Figure 1:
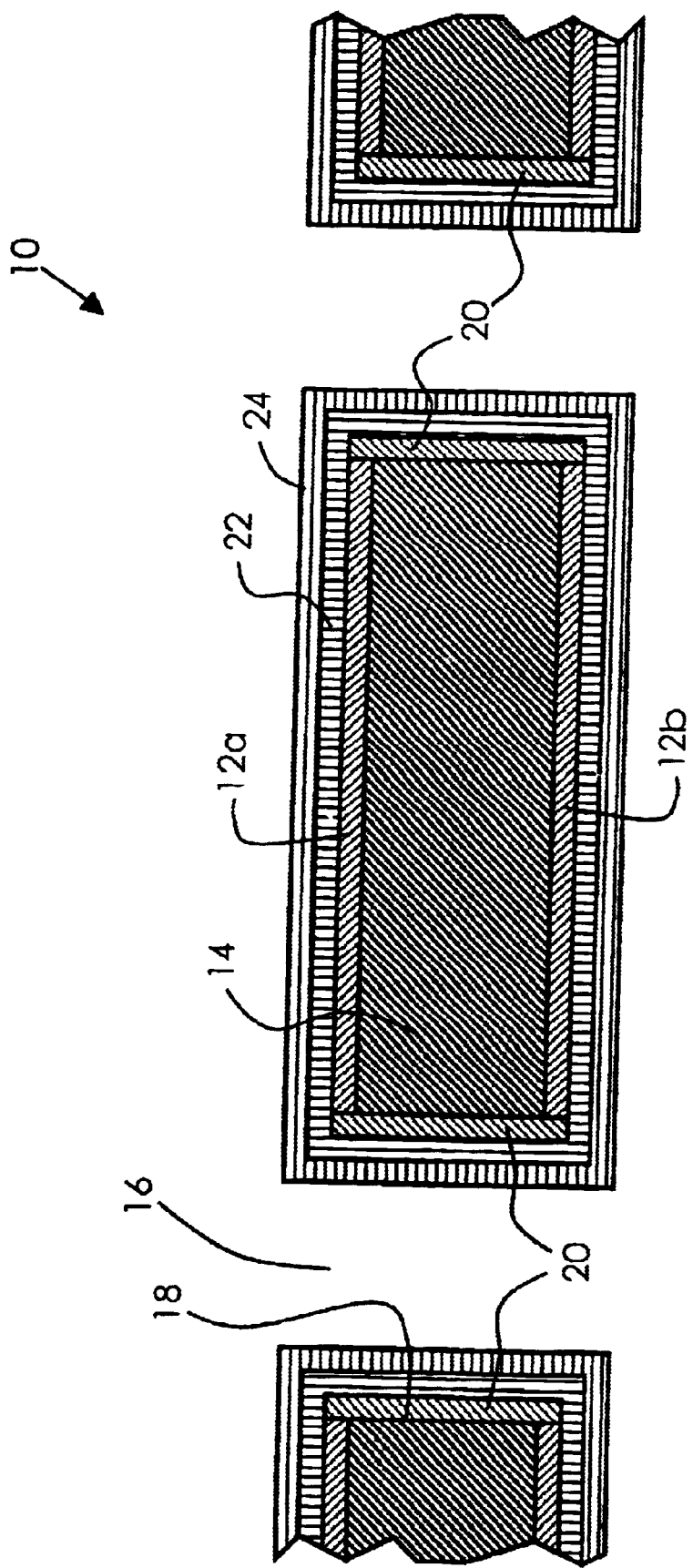
FIG. 1 is a diagrammatic cross-sectional view of a printed wiring board of the present invention after electroplating.

While the invention will be described in connection with one or more preferred embodiments, it will be understood that the invention is not limited to those embodiments. On the contrary, the invention includes all alternatives, modifications, and equivalents as may be included within the spirit and scope of the appended claims.

In one embodiment of the method according to the present invention, an originally non-conductive surface is cleaned, conditioned, treated with a conductive carbon composition, the carbon composition is optionally fixed, and the carbon composition is dried to form an electrically conductive coating. The materials and steps used in this preferred embodiment are set out below in more detail.

Nonconductive Surface

The nonconductive surface can be any material that does not conduct electricity well, or at all. An example of a suitable nonconductive surface is a resin-glass fiber composite board of the type conventionally used as a printed wiring board. Further examples of suitable nonconductive surfaces are the walls of a through hole or via that has been drilled, ablated by application of laser energy, or built up by an additive process. Another example of a suitable nonconductive surface is a glass surface, such as the glass envelope of a television tube, video monitor, or similar device, or a sheet of window glass. Still another example of a suitable nonconductive surface is a polymer or glass/polymer composite surface, such as the face of a printed wiring board. Many other suitable nonconductive substrates are well known to those skilled in the art.

Cleaner/Conditioner

Commonly, the first step of the present process is cleaning the substrate that is to be plated. In the cleaning step, the substrate is thoroughly wetted and contaminants such as grease, oil, or dirt are removed from the substrate that is to receive plating.

Commonly, the next step is a conditioning step, during which the substrate is contacted with a conditioning agent. The contemplated conditioning agent is a substantive material, commonly a cationic material such as a polyamidoamine, a cationic polymer, a cationic surfactant, or the like. The conditioning agent is applied as an adhesion promoter so the substrate will be attractive to the anionic particles of carbon that are later applied by contacting the substrate with a carbon dispersion.

The conditioner can be an alkaline aqueous solution or dispersion of a base and a conditioning agent. The useful conditioning agents include those selected from the group consisting of:

SANDOLEC CF
SANDOLEC CU
SANDOLEC CS
SANDOLEC CL
SANDOLEC CT
CALLAWAY 6818
CYASTAT SP
CYASTAT LS
CYASTAT SN
CYANAMER A-370
MAGNIFLOC 496
DAXAD CP2
PRIMAFLO C C3
CAT-FLOC
CAT-FLOC T
RETEN 210
POLYTEC 7M
PERCOL 727
PERCOL 763
OCTOPOL SDE-25
OCTOPOL SDM-40
GLO-CLEAR 2202
GLO-CLEAR 2220
GLO-CLEAR 2283
PRIFRAC 2990
ALUBRAFSOFT GSS
FIBRABON 35
DENSEFLOC 30
CALLAWAY 6817
CALLAWAY 6831 and combinations of those conditioners. A preferred conditioning agent is made from any of the CALLAWAY or SANDOLEC materials, used alone or in combination to provide polyamide epichlorohydrin resins. Examples of these materials are CALLAWAY 6818 polyamide epichlorohydrin resin, available from Callaway Chemical Co., Columbus, Ga., or SANDOLEC CF, available from Clariant Corp., Charlotte N.C.

The bases contemplated here include lower alkanol amines (lower alkanol being defined as 1- to 4-carbon alcohol moieties), such as ethanolamines, for example mono-, di- or triethanolamine; alkaline materials generally, such as alkali metal hydroxides, carbonates, and bicarbonates, for example potassium hydroxide, carbonate, or bicarbonate; other materials capable of raising the pH of the composition, preferably to at least about 9; and mixtures of such materials.

A representative formulation for a conditioner is from about 5–30 parts by weight of a base as previously defined, from about 5 to about 90 parts by weight of a conditioning agent selected from the preceding list, and sufficient deionized water to make 1,000 parts by weight of the complete conditioner.

Optionally, 0.5 to about 5 parts by weight of an alkylene glycol can be added to the conditioner composition. The alkylene glycols contemplated herein include 1- to 4-carbon alkylene glycols and their dimers and oligomers. Specific alkylene glycols contemplated herein include ethylene glycol, propylene glycol, butylene glycols, diethylene glycol, triethylene glycol and mixtures of such materials.

Optionally from about 0.5 to about 5 parts by weight of a chelating agent may be added to the conditioner composition. The chelating agents contemplated herein include alkali metal salts of ethylenediaminetetraacetic acid (EDTA), for example, sodium EDTA (Na4EDTA). Other suitable chelating agents may also be readily found by one of ordinary skill in the art.

Optionally, particularly if the base employed is an alkali metal salt, a buffer may be added to the composition. Adding a carbonate-bicarbonate buffer to the conductive composition can provide a pH in the preferred range. The use of other pH buffering systems, such as phosphate, acetate, borate, barbital, and the like, are well known in the art. The anions of the buffer may be associated with any suitable cation, such as an alkali metal cation, such as sodium, potassium, or lithium, or an ammonium cation.

The cleaning step may optionally be combined with the conditioning step, by formulating a single cleaner/conditioner composition that both cleans and conditions the substrate at the same time.

Cleaning compositions, conditioning compositions, and cleaner/conditioner compositions contemplated for use in the invention are described in detail in U.S. Pat. No. 5,725,807, which has been incorporated by reference, and in material incorporated therein by reference.

Rinsing

Rinsing steps are optionally added between various reagent baths to prolong the life of the subsequent reagent baths. Typically, the rinsing medium is plain or deionized water. For example, if cleaning and conditioning steps are separately carried out, it is common to insert a water rinse step between the cleaning and conditioning steps. Rinsing steps are also commonly used after conditioning the substrate and after microetching (if microetching is carried out).

Water rinsing may be carried out by flooding, dipping, or spraying, as appropriate, and can be carried out at a temperature the same as one of the temperatures at which the preceding or following steps are carried out, at an intermediate temperature (to provide a temperature transition), or at a different temperature (most simply, at room temperature). The rinsing time may vary—1–2 minutes at room temperature is a common rinsing time. Rinsing may be more or less aggressive. More aggressive rinsing may be carried out with mechanical scrubbing or by means of a high-pressure spray. Less aggressive rinsing may constitute merely soaking the substrate in the rinsing medium without mechanical action.

Carbon Dispersion

Another step in the process is application of a conductive carbon dispersion. A detailed description of the ingredients of the dispersion and how it is made and used follows. Additional disclosure is provided from page 14, line 9, to page 58, line 9, of U.S. Ser. No. 08/471,871, filed Jun. 7, 1995, now U.S. Pat. No. 5,690,805. That text is hereby incorporated by reference in the present disclosure.

One component of the present conductive compositions is electrically conductive carbon, for example, carbon black, graphite, or combinations of the two.

The electrically conductive carbon particles should be present in an amount effective to provide an electrically conductive coating when the composition is applied to a substrate. The carbon may be present as from about 0.1 to about 20% by weight, alternatively from about 0.5 to about 10% by weight, alternatively from about 1% to about 7% by weight, alternatively from greater than about 4% to about 6.5% by weight of the composition.

The carbon may have a mean particle size within the range from about 0.05 to about 50 microns, alternatively from about 0.3 to 1.0 microns, alternatively from about 0.7 to about 1.0 microns. From the perspective of performance and ease of dispersion, particles from the smaller end of the size range are preferred. However, smaller particles, particularly graphite particles, are more costly. The inventors have found it unnecessary to obtain graphite having mean particle sizes substantially less than one micron, contrary to the conventional belief that extremely fine graphite is necessary.

The carbon black useful herein can be substantially as described in U.S. Pat. No. 5,139,642. The carbon black description of that patent is hereby incorporated herein by reference in its entirety.

The graphite useful herein can be substantially as described in U.S. Pat. No. 5,139,642. The graphite description of that patent is hereby incorporated herein by reference in its entirety. In the present compositions, the graphite may be either synthetic or naturally occurring. Aqueous dispersions of carbon black or graphite are well known in the art and in related arts, such as lubricating compositions and conductive coatings for other purposes.

Another component of the present compositions is a water soluble or dispersible binding agent for binding the carbon particles. The binding agent is believed to assist the dispersed carbon particles in adhering to the surface of the non-conductive (i.e., dielectric) substrate, which is to be made conductive for electroplating. The binding agent should be present in an amount effective to bind the carbon particles to a substrate. The binding agent may be present as from about 0.05% to about 15% by weight, or from about 0.2 to about 10% by weight, or from about 0.5% to about 6% by weight, or from about 1.5% to about 3% by weight, of the composition for binding to the carbon particles.

The binding agent is preferably any natural or synthetic polymer, polymerizable monomer, or other viscous or solid material (or precursor thereof) that is capable of both adhering to the carbon particles and of receiving an anionic dispersing agent (as described below). Alternatively or additionally, the binding agent can be capable of dispersing the carbon particles to which it adheres in the aqueous medium of the dispersion.

For example, the binding agent may be a water-soluble or water dispersible material selected from the group consisting of mono- and polysaccharides (or, more broadly, carbohydrates) and anionic polymers. Polysaccharide (which for the present purpose includes disaccharide and higher saccharide) binding agents contemplated for use herein include corn starch, other starches, and polysaccharide gums. Polysaccharide gums contemplated for use herein include agar, Arabic, xanthan (for example, KELZAN industrial grade xanthan gum, available from the Kelco Div. of Merck & Co, Inc. of Rahway, N.J.), pectin, alginate, tragacanath, dextran, and other gums. Derivative polysaccharides contemplated for use herein include cellulose acetates, cellulose nitrates, methylcellulose, and carboxymethylcellulose. Hemi-cellulose polysaccharides contemplated for use herein include d-gluco-d-mannans, d-galacto-d-gluco-d-mannans, and others.

Anionic polymers contemplated herein include the alkylcelluloses or carboxyalkylcelluloses, their low- and medium-viscosity alkali metal salts (e.g. sodium carboxymethylcellulose, or "CMC"), cellulose ethers, and nitrocellulose. Examples of such anionic polymers include KLUCEL hydroxypropylcellulose; AQUALON CMC 7L sodium carboxymethylcellulose, and NATROSOL hydroxyethylcellulose. These are all commercially available from Aqualon Company of Hopewell, Va. Anionic polymers contemplated herein further include ethylcellulose, available from Hercules of Wilmington, Del.; METHOCEL cellulose ethers, available from Dow Chemical Co., Midland, Mich.; and nitrocellulose, which is also available from Hercules.

Two specific binding agents contemplated here are starch or an alkali metal carboxymethylcellulose.

As is plain from the foregoing and the further disclosure incorporated by reference above, organic binding agents are preferred, although inorganic binding agents are also contemplated for use herein.

A practical upper limit to the amount of binding agent used is contemplated to be that amount which materially interferes with the conductivity of the resulting conductive coating by diluting the conductive solids in the composition after it is deposited as a film and dried.

Another component of some of the present compositions is an anionic dispersing agent. The anionic dispersing agent has a molecular weight less than about 1000 Daltons (one Dalton is 1/16 of the atomic weight of an oxygen atom), so it is a substantially smaller molecule than the binding agent. Anionic dispersing agents are specified in more detail in the patents incorporated by reference in the Cross Reference section above.

An optional component of some of the compositions of the present invention is a surfactant. One function of the surfactant is to decrease the surface tension of the aqueous dispersing medium, so the aqueous dispersing medium containing the dispersed carbon particles is able to freely penetrate into the recesses. A second function of the surfactant is to wet the surfaces of the polymeric and glass substrates. This facilitates the coating of these surfaces with the carbon dispersion.

The amount of surfactant that is used in any particular case will vary depending upon the surfactant itself. The composition typically contains from about 0.01% to about 10% by weight, or from about 0.02% to about 3% by weight, or from about 0.05% to about 1% by weight of the composition, of the surfactant.

Suitable surfactants for use in the present invention include TRITON X-100, sold by Rohm and Haas Co., Philadelphia, Pa.; MAPHOS 56, sold by Mazer Chemicals, Inc.; TAMOL 819L-43, 850, and 960 anionic surfactants, available from Rohm and Haas Co., Philadelphia, Pa.; FLUORAD® FC-120, FC-430, FC-431, FC-129, and FC-135 anionic fluorochemical surfactants; sold by Minnesota Mining & Manufacturing Co., St. Paul, Minn.; DARVAN No. 1, sold by R. T. Vanderbilt Co.; ECCOWET LF, sold by Eastern Color and Chemical; PETRO ULF, sold by Petro Chemical Co. Inc.; POLYTERGENT B-SERIES surfactant, sold by Olin Corporation; and others. Cationic and other surfactants may also be used, depending upon the pH and other characteristics of the composition.

Another component of the compositions of the present invention is an aqueous dispersing medium. The phrase, "aqueous dispersing medium," as used herein, includes any solvent that is from 80 to 100% water wherein the balance of the material is a water-soluble composition. Typical water-soluble compositions include the low molecular weight alcohols, such as methanol, ethanol, and isopropanol. Additional solvents such as dimethylsulfoxide, tetrahydrofuran, and ethylene or propylene glycol may also be used. Alternatively, the aqueous dispersing medium may be 100% water. Deionized water is preferred.

The resulting composition is a carbon dispersion that is capable of depositing a uniform, low resistivity coating of carbon particles on the non-conductive surfaces of a through hole or other nonconductive surface. The composition of the present invention may be used "as is," or it may be sold in concentrate form and then diluted up to tenfold (10:1), preferably up to fourfold (4:1), at the point of use. The composition may be diluted with an aqueous dispersing medium, which may include one or more of a buffer, a dispersing agent, a surfactant, or other ingredients.

A suitable carbon dispersion, containing sub micron graphite and a water dispersible binding agent in amounts effective to form a substantially continuous, electrically conductive carbon coating on a suitably conditioned surface, is SHADOW® 2, sold by Electrochemicals Inc., Maple Plain, Minn.

The carbon dispersion is applied to the non-conductive, conditioned substrate from a bath or by flooding in most instances, although roller-coating processes may also be used. A dip time of 4–6 minutes at 90° F. (32° C.) is typical for a dip process, and a process time of about 20 to 60 seconds is typical for a conveyorized process, though other times and temperatures may be appropriate. The carbon-coating step is carried out under conditions effective to leave an excess of unbonded carbon dispersion on the conditioned surface.

Adhesion Promotion

The conductive coating can be formulated as described above to adhere directly to a non-conductive substrate, without the need for a separate adhesion promoter to aid the adhesion of the conductive coating. However, one or more adhesion-promoting ingredients can be separately formulated in a cleaning, conditioning, rinsing, or adhesion-promoting composition that is applied to the substrate before, after, or at the same time as the conductive composition is used. Conditioners and binding agents thus can be formulated separately, instead of or in addition to putting the conditioners and binding agents in the conductive composition per se.

All these adhesion-promoting methods and compositions are regarded to be part of the present invention, whether the adhesion promoter is formulated and applied with the conductive composition or in a separate composition.

The adhesion promoter can be applied in a dip or conveyorized process, within the scope of the present invention.

Fixing

An optional treatment according to the present invention is fixing the conductive coating. After contacting the substrate with a carbon dispersion and before drying it according to the present process, one may employ a fixing step. The fixing step is important in the treatment of printed circuit boards, since it makes the carbon dispersion more workable. Suitable fixing agents and fixing methods not involving the application of a fixing agent are described in the United States patent applications to which priority is claimed in this document.

Fixing may be accomplished in at least two different ways, referred to here as the chemical fixing method and the physical fixing method.

The chemical fixing method can be carried out by applying a fixing solution to the surfaces that have been wetted by the carbon dispersion. The fixing solution removes excessive carbon composition deposits, and thus smooths the carbon coating on the recess surfaces by eliminating lumps and by making the coating more uniform.

In the chemical fixing step, the fixing solution may be water, an aliphatic or aromatic solvent, or a dilute aqueous acid, salt, or other solute. If water is used, the water desirably is warm (120–140° F., 49–60° C.) to effect fixing. Many dilute solutions are capable of fixing the bound carbon at room temperature or warmer. Fixing is typically accomplished by a 30–60 second exposure of the carbon coating to the fixing solution.

Typical acid fixing solutions include dilute aqueous solutions containing from 0.1–5% by volume of an acid. Convenient acids useful herein include mineral acids, such as hydrochloric, phosphoric, nitric, or sulfuric acid. Organic carboxylic acids, such as acetic acid, citric acid, fumaric acid, oxalic acid, and others may also be used. A specifically contemplated fixing solution is a dilute aqueous solution of sulfuric acid, such as an aqueous solution containing 0.1–2% sulfuric acid by volume. Acidic fixing solutions that contain less than 0.1% acid may require some heat to effect fixing within the typical 30–60 second exposure.

An acid fixing bath contemplated for use herein contains sufficient acid to provide a pH of from about 0.01–6, alternatively from about 0.1 to about 4, alternatively about 0.7, which may be provided by using from about 0.1 to about 0.5% by volume of concentrated sulfuric acid in deionized water. The normality of the acid may be from 0.07N to 0.17N, alternatively from 0.01N to 1.0N, alternatively from 0.001N to 5N. The bath may be used at room temperature (for example, about 70° F. or 20° C.), or alternatively at from about 125° to about 135° F. (from about 52° to about 57° C.).

Other fixing solutions are also contemplated herein. Exemplary fixing solutions are described in U.S. Ser. No. 08/975,613, filed Nov. 21, 1997, now pending, which has been incorporated by reference above.

The fixing step may be carried out in a vertical process in about 30–60 sec at 130° F. (54° C.), in one embodiment. The fixing step may also be carried out by using flooding or spraying processes, particularly in a horizontal or conveyorized embodiment.

In the physical fixing method, the recesses or other substrates, which have been wetted with the carbon dispersion, are subjected to a mechanical force that removes excess deposits of the carbon coating before it is dried. The mechanical force may be applied in a wide variety of ways, within the scope of the present invention.

One contemplated embodiment of this mechanical force is the action of a fluid jet contacting the surfaces that have been coated with the carbon dispersion. In a more specific embodiment, a fluid jet of air or another gas is directed through the recesses or against the surfaces that have been treated with the carbon dispersion. The jet blows away any excess accumulation of the carbon deposit, and particularly any occlusions of the carbon dispersion, which can in some instances block through holes or other recesses.

In a practical printed wiring board fabrication line, the air jet can be provided in the form of an "air knife"—a curtain of moving air. The curtain is formed of air or another gas traveling perpendicular to the surface of the wiring board, through which the wiring board is passed to blow out the recesses and thus fix the carbon dispersion. The air pressures contemplated for use in an air knife process are typically 3–4 psi—2–3 $N/cm^2$—or more broadly from less than 3 psi (2 $N/cm^2$) to 30 psi (20 $N/cm^2$) or more. The curtain of air may also be heated, thus further assisting in drying the substrate. Alternatively, air from a source nominally at 50 psi (35 $N/cm^2$), held at or near room temperature, can be directed against the printed wiring board to blow out excess material in through holes.

The fixing step is typically carried out after said carbon dispersion contacting step, without an intervening drying step.

Without intending to be bound by the accuracy of the present theory, the inventors contemplate that fixing provides one or more of the following benefits:

reducing excess deposits of the carbon dispersion, preferably providing substantially a monolayer of carbon particles; or crosslinking the binding agent, such as a sodium carboxymethylcellulose or polysaccharide binding agent, of the remaining carbon coating to better bind the carbon to the non-conductive surface;

neutralizing or crosslinking the carboxyl groups, thereby causing the dispersed and bound carbon particles to precipitate on the recess bore;

chemically bonding (or at least ionically attracting) at least some of the water-dispersible binding agent of the graphite dispersion to the conditioner film, directly or through cross-linking.

This fixing step is believed to selectively bond a thin layer of the carbon dispersion, and thus a thin conductive layer, to the film of conditioner already on the substrate. It is particularly contemplated that this binding will occur if the conditioner contains a polyamide epichlorohydrin resin, the carbon coating dispersion contains a polysaccharide binding agent or other material reactive with a polyamide epichlorohydrin resin, and the fixing step is carried out using an aqueous acid solution that provides low-pH conditions.

It is surprising that a crosslinked coating of this nature can improve adhesion of the coating without interfering with microetching.

Drying

After the carbon dispersion is applied and fixed, the carbon-coated portion of the substrate typically is dried, thus depositing a dry carbon coating on the substrate. Drying is understood to more fully crosslink the carbon coating, as well.

The substrate may be dried in an oven. Drying may be accomplished by using heated air (in the fixing step or later), by employing heat lamps, microwave energy, or other radiant, conductive, or convective heat sources; by application of ultrasound; by simple air drying at ambient temperature; or by other drying techniques. A skilled person is readily able to devise an appropriate method of drying the substrate. Typical drying conditions might be oven-drying for 15 to 18 minutes at 140° to 180° F. (60–82° C.). The method described in U.S. Pat. No. 5,139,642 may also be employed.

The resulting dry, electrically conductive coating is essentially free of lumpiness and voids.

Microetching

When the recesses of printed wiring boards are being prepared for plating, the boards normally are already copper clad. The typical processes for treating the non-conductive surfaces incidentally contact the copper-clad surfaces with the various recess treating reagents, including the carbon dispersion. It commonly is desirable to remove the carbon dispersion coating and other residues from the already copper-clad surfaces of the printed wiring board before the recesses of the board are electroplated. One such removal process contemplated here is called microetching.

Microetching is carried out by exposing the carbon-coated printed wiring board to an etchant which removes a slight amount of copper from the copper clad surfaces of the substrate, without removing enough of the carbon coating on the non-copper-clad surfaces to destroy its conductivity. The carbon coating typically is sufficiently porous to allow the underlying copper layer to be attacked. When the underlying surface to which the carbon deposit adheres is microetched, the carbon deposit flakes away from the copper-clad surfaces while remaining intact in non-copper-clad areas, such as the recess walls.

Microetching compositions are conventionally used in connection with carbon dispersion coating processes. One example of a known formulation is bath 9 described in column 17, lines 19–28, of U.S. Pat. No. 5,139,642, which is incorporated here by reference.

Microetching compositions may be deployed by dipping the substrate in a microetch bath or by spraying the substrate with a microetch composition.

After microetching, the substrate is preferably rinsed to remove residual flakes of carbon and to maintain the integrity of the subsequent reagents. The rinse may be carried out by immersing the substrate in a bath, by spray rinsing the substrate, or otherwise.

The result of microetching is that the originally copper clad surfaces are freed of the carbon deposit, while the non-metallic, originally nonconductive walls retain the deposit and thus remain conductive. The copper-clad surfaces thus can form low-resistance connections with the plating electrodes when the recesses are electroplated.

Microetching can be problematic when the through holes or vias to be microetched have a high aspect ratio, or when the copper or other metal conductive surface on the through hole or via is thin. In these situations, the present invention provides particularly advantageous microetching results. The use of a cleaner/conditioner according to the present invention is contemplated to improve the adhesion of the carbon coating, and makes microetching more successful under these difficult conditions.

Drying

After microetching, the conductive substrate is commonly dried before electroplating. Drying may again be carried out in any of the conventional ways known to those skilled in the art, such as those described previously.

Process Lines

The present process can be carried out in a variety of equipment. Two common types of equipment are vertical or dip process equipment, in which the reagents are in stationary baths into which the vertically-disposed boards are sequentially dipped, and conveyorized or horizontal equipment in which the boards are flooded or sprayed with the respective reagents while disposed and traveling substantially horizontally. Either type of equipment, or any combination of the two types of equipment, may be used within the scope of the present invention. Ultrasonic energy may be used in the process baths to improve performance.

Electroplating

Electroplating may be carried out essentially conventionally. The electroplating processes described below and other processes known to those skilled in the art, including the particular process employed in U.S. Pat. No. 5,139,642, from col. 17, line 43, to column 18, line 5, may be used.

Result of Plating Process

When the plating process is complete, the deposited plating is substantially continuous, essentially without voids, and resistant to pullaway (which resembles a blister in the plating) and other adhesion defects, even when the most severe thermal shock tests are performed. The plating optionally can be coated with molten solder, forming a soldered continuous metal layer that is substantially free of voids and pullaway.

The process can be carried out under conditions effective to provide an electrically conductive carbon coating having an electrical resistivity of less than about 1000 ohms, alternatively less than lower resistivity levels provided in the documents previously incorporated by reference.

Printed Wiring Boards

The present invention allows the manufacture of printed wiring boards having conductive recesses. Such boards are made by applying any of the compositions described above to a printed wiring board, optionally having one or more recesses, in accordance with any of the methods described above. A printed wiring board in accordance with the present invention is shown in FIG. 1. The printed wiring board, shown generally at 10, includes at least two conductive circuit layers 12a and 12b separated by nonconductive material 14. At least one recess 16 in the nonconductive material has a nonconductive surface 18 intersecting at least two of the conductive circuit layers 12a and 12b. The printed wiring board 10 may have more than one conductive coating, but preferably has a single coating 20 provided by a one-pass coating process, which provides the recesses 16 with adequate conductivity for electroplating. This coating includes electrically conductive carbon having a mean particle size not greater than about 1 micron and a water dispersible organic binding agent. The printed wiring board is then electroplated to form a copper layer 22 over the conductive coating 20 to thereby provide a printed wiring board having copper clad recesses. In the embodiment shown in FIG. 1, the printed wiring board is further coated with solder, forming a soldered continuous metal layer 24.

The present process may be used with a wide variety of different technologies for printed wiring board fabrication, and in many other processes for electroplating originally nonconductive substrates.

In conventional printed wiring board fabrication, through holes (holes extending through a printed wiring board from one side to the other) or vias (blind holes) are drilled into a metal-clad non-conductive board, and the present method is used to provide a conductive coating on the non-conductive through hole or via walls.

The present method can also be used to fabricate printed wiring boards using other technology. For example, in photoimageable dielectric (PID) fabrication, isolated conductive regions such as circuit lines are formed on a printed wiring board, then covered with an imageable dielectric coating which is selectively etched away to once again expose selected portions of the isolated conductors which are to be connected by interconnects. Interconnects are formed by applying the present composition to the surface of the imaged dielectric coating, then electroplating the coated surface with copper to provide a copper interconnect.

In resin-coated copper technology, an imaged copper interlayer is covered with a resin dielectric which is then cut with a laser or plasma cutting tool, providing very small diameter (currently as small as 0.75 mil) vias having non-conductive resin walls. These walls can be made conductive, facilitating electroplating to provide interconnects, by applying a coating of a conductive carbon composition according to the present invention. The inventors contemplate that this process can be used without microetching, which is an advantage because the metallic floors of small-diameter recesses made as described here are difficult to reach with microetching solution. If microetching is used, it can be used more successfully for these small-diameter recesses, according to the present invention. This process also has an advantage over electroless copper technology, as electroless copper chemicals can form gas bubbles which can occlude small-diameter vias or recesses. The present compositions preferably do not generate gas.

The present invention can also be used to make an entirely nonconductive surface electrically conductive, as when no conductive portions at all are initially present. In this instance, microetching is unnecessary, as no preexisting metal conductors are covered when the carbon composition is applied.

Resistance Measurements

The resistance of a printed wiring board that has been treated to make selected surfaces conductive is measured as an indication of the amount of time that will be required to electroplate the coated surfaces. The lower the resistance, the more rapidly electroplating can proceed. The resistance of the through holes of a double-sided circuit board is conventionally measured by measuring the resistance between the two metal-clad surfaces on opposite ends of the through holes. Thus, one through-hole resistance value is obtained for an entire printed wiring board before electroplating proceeds.

A single printed wiring board commonly has many through holes of varying diameters. The number of through holes depends upon the size of the circuit board and the particular circuit it will carry. For example, a typical 18 inch by 24 inch (46 cm by 61 cm) board may have 3000 holes with diameters varying from about 6 mils (0.15 mm) to about 0.25 inch (6 mm). Also, a board may have a thickness of from about 1 mil (25 microns) to about 0.25 inch (6 mm.).

Multiple through holes create parallel conductive paths, so the net resistance of all the through holes on the board is less than the resistance of one through hole. The more electrically interconnected through holes there are, the lower the resistance, other things being equal. The diameter of the through hole determines the cross-sectional area of its conductive surface, so a larger diameter through hole has a lower resistance than a smaller diameter through hole, other things being equal. The thickness of the board determines the length of each conductive through hole. The thicker the board, the longer each through hole and the higher its resistance, other things being equal.

Finally, "other things" are not equal, so even if the number and dimensions of the through holes are known, the resistance of each through hole cannot be directly calculated with any accuracy. Different through holes on the same board may have different coating thickness, the coating is applied on an irregular bore surface, fluid circulation in a bath to the various holes is different, and so forth.

One can also determine the resistance of a single through hole. This can be done in at least two ways. One way is to coat the through hole of a coupon (a sample of metal-clad printed wiring board material which is not intended to be used in a circuit) or an actual printed wiring board which has only a single through hole, so the resistance of the board is the same as the resistance of that through hole. A second way is to isolate one through hole electrically by severing the cladding which links other through holes to the through hole that is being measured for resistivity. Thus, where the resistance of a through hole is given in this specification or in the claims, the resistance of a single through hole in electrical isolation, measured before electroplating, is meant.

Notwithstanding these many variations, the industry commonly draws conclusions about the conductivity of the through holes from a single resistance measurement per printed wiring board. For example, the 18 by 24 inch (46 by 61 cm) board referred to previously, coated with the preferred graphite composition according to the present invention in one pass, commonly has a resistivity of about one ohm through its through holes, which rises to about 10 ohms after microetching. The same board coated using the commercially available two-pass BLACKHOLE carbon black process has resistivities more than ten times as great, and sometimes 50 to 70 times as great, as those of the preferred graphite composition. Thus, where the resistance of a printed wiring board is given in this specification or in the claims, or if a resistance is given without specifying the manner of measurement, this single measurement, made prior to electroplating, is meant. Of course, if two boards have identical numbers, patterns, and sizes of through holes, the resistances of the entire boards can be directly compared to obtain useful results.

Extending resistance measurements to vias, whether drilled, laser cut, or otherwise formed, the same principles generally apply. Where a printed wiring board or other substrate has isolated metallic conductors bridged by a carbon composition of the present invention, the resistance between the isolated metallic conductors can be measured to determine the conductivity improvement resulting from application of the present conductive carbon compositions.

When the present invention is used to improve the through hole or via conductivity of an entire printed wiring board, the board has an electrical resistivity of less than about 1000 ohms, optionally less than about 600 ohms, optionally less than about 400 ohms, optionally less than about 250 ohms, optionally less than about 80 ohms, optionally less than about 60 ohms, optionally less than about 30 ohms, optionally less than about 10 ohms, optionally less than about 2 ohms, optionally less than about 1 ohm, each measured prior to electroplating the through hole.

When the present invention is used to improve the conductivity of an individual through hole, the treated through hole has an electrical resistivity of less than about 5000 ohms, optionally less than about 1000 ohms, optionally less than about 600 ohms, optionally less than about 400 ohms, optionally less than about 250 ohms, optionally less than about 80 ohms, optionally less than about 60 ohms, optionally less than about 30 ohms, optionally less than about 10 ohms, each measured prior to electroplating the through hole.

Coating Uniformity Determination

A thin, uniform coating of the carbon composition on the through holes is important so the plating which is deposited on the coating will not suffer from pullaway, particularly when subjected to the thermal shock of soldering. The fixing step is important to provide the necessary uniform, thin coating.

The inventors contemplate that the coating ideally will be nearly as thin as the diameters of the dispersed particles of carbon, so it will form a monolayer of carbon particles. For example, a composition containing one-micron mean diameter particles would provide a film on the order of one micron thick. More particularly, the inventors contemplate a coating of from about one to about three microns thick. Thinner coatings are acceptable until the coating becomes so thin that complete coverage is not obtainable.

The inventors contemplate that coatings more than about 3 microns thick will start to present problems. Pullaway (a place where the plating delaminates) becomes more probable in this thickness range. A region of the coating as thick as about 7 microns is contemplated to be less desirable, while a coating of about 12 microns is contemplated to be still less desirable. When part of the coating becomes as thick as roughly 7 microns, it becomes visible when a 200 power (200× magnification) microscope is used to examine the plated through hole. Thus, another definition of the appropriate coating thickness is a coating which is too thin to see in a plated through hole cross-section under a 200 power microscope. Thus, an electrically conductive coating at most about 12 microns thick, alternatively at most about 7 microns thick, alternatively at most about 3 microns thick is contemplated.

The degree of uniformity of the coating is sometimes expressed qualitatively by reporting that the coating in question exhibits, or is free of, lumpiness or localized areas having a thick coating of the carbon coating. Lumpiness (if present) typically is found at the entrance or exit of a through hole (i.e. at the corners of a rectangular cross-section of a cylindrical hole), and is manifested as visible (under a 50× microscope) non-uniform areas of plating projecting inwardly from the plane defined by the wall of the through hole bore. Expressed another way, a plated through hole bore is free of lumpiness if the plating appears to be a straight line down each side of the through hole connecting the conductive cladding at each end of the hole, when viewed in cross-section at 50× magnification.

The following example is provided to describe a specific embodiment of the invention and to demonstrate how it works. By providing this specific example, the inventors do not limit the scope of the invention. The full scope of the invention is all the subject matter defined by the claims concluding this specification, and equivalents thereof. Additional examples and details respecting the practice of the invention may be found in U.S. Pat. No. 5,690,805. That text is incorporated by reference in the present disclosure.

EXAMPLE

This example is carried out on printed wiring board coupons to provide conductive vias and through holes. The following compositions and equipment are set up for this purpose.

A cleaner/conditioner working solution was prepared containing, per liter:

| | | |
|---|---|---|
| Monoethanolamine | 2.4–24 | g/L |
| SANDOLEC CF[1] | 1.25–12.5 | g/L |
| NEODOL 91-8[2] | 0.6–60 | g/L |
| CALLAWAY 6818[3] | 7.5–75 | g/L |
| Ethylene glycol | 0.07–0.7 | g/L |
| VERSENE 100 | 0.1–1.0 | g/L |
| Deionized Water | To 1 liter | |

[1] Registered trademark for polyamidoamine sold by Clariant Corp., Charlotte, North Carolina
[2] Registered trademark for the condensation product of $C_9$–$C_{11}$ linear alcohol with 8 moles of ethylene oxide, sold by Shell Chemical Company.
[3] Registered trademark for polyamide epichlorohydrin resin available from Callaway Chemical Co., Columbus, Georgia.
[4] Registered trademark for tetrasodium EDTA, sold by Dow Chemical Company, Midland, Michigan.

SHADOW® 2 was used as the conductive carbon dispersion; it contains graphite as the source of carbon and a proprietary polysaccharide as a binder. SHADOW 2 is commercially available from Electrochemicals Inc, Maple Plain, Minn.

To provide a chemical fixing solution, sixteen ml. of concentrated sulfuric acid were added to a sufficient volume of DI water to avoid splattering and then diluted to 4 liters.

Line Makeup For Graphite Process

1) Working Cleaner/Conditioner at 135° F. (57° C.) for 3 minutes.
2) Rinse: DI water at room temperature (about 70° F. or 21° C.) (abbreviated "RT") for 1 minute.
3) Graphite composition: SHADOW® 2, diluted to recommended use concentration, at room temperature for five minutes.
4) Fixer: at 135° F. (57° C.) for 30 seconds.
5) Rinse: tap water at room temperature, 30 sec.
6) Oven Dry for 15 minutes, at 190° F. (88° C.).
7) Microetch: 150 g of sodium persulfate and 10 ml of sulfuric acid per liter of aqueous solution, at room temperature for 1 minute.
8) Rinse: deionized water at room temperature for 1 minute.
9) Acid Cleaner: formulation 17A (Electrochemicals Inc.) at 120° F. (49° C.) for 3 minutes.
10) Rinse: deionized water at room temperature for 1 minute.
11) Acid treatment: aqueous sulfuric acid (10% v/v) at room temperature for 30 seconds.
12) Acid Copper electroplating solution: Electrochemicals PC 667 at room temperature for 10 minutes.
13) Rinse: deionized water at room temperature for 1 minute.
14) Oven Dry for 5 minutes, at 195° F. (91° C.).

The processed coupons (plated for ten minutes, per step 12 above) are evaluated by backlight and graded on a scale of 1–10, with 10 being the best result. The selected fixer formulations and the resulting resistivity (measured between the drying step 5 and the microetch step 6 of the process) and backlight scores for room temperature fixing and for fixing at 135° F. (57° C.) are measured and found commercially suitable.

The incidence of defects was measured for these examples by using the Hot Oil Test. The Hot Oil Test has been devised to measure the proportion of through holes which release visible gas when immersed in a body of essentially non-volatile liquid held at an elevated temperature substantially exceeding the boiling temperature of water. The gas may be water vapor, air or other gases. The test is carried out much like the hot oil test described and illustrated in F. H. Howie and C. Lea, *Blowholing in PTH Solder Fillets, Part 2, The Nature, Origin and Evolution Of The Gas*, CIRCUIT WORLD, Vol. 12 No. 4 (1986) (see, e.g., FIG. 8 and the accompanying text on that page and the following two pages, particularly notes 3 and 5).

In the present Hot Oil Test, two-inch (5 cm) square coupons, each having 70 plated through holes, were prepared according to the present invention or a control, then electroplated. Each coupon was immersed in a hot oil bath and viewed via a video camera, which provided an enlarged image of the coupon on a monitor. The presence or absence of gas bubbles under the test conditions was noted for each through hole. The test was scored by counting the number of outgassing through holes, multiplying that number by 100%/70 holes, and reporting the total as a percent. In the Hot Oil Test, the percentage result reported represents the incidence of defects; a lower result indicates fewer defects, thus better performance. The following results were obtained:

| # | Ultrasonic in Cleaner/Conditioner? | Hot Oil Test (Duplicate runs) | |
|---|---|---|---|
| A | No | 25% | 49% |
| B | Yes (5 minutes, in cleaner/conditioner bath) | 11% | 15% |

The above table shows that when the cleaner/conditioner was agitated by ultrasonic energy, in part B of the test, the hot oil test provided much better results.

Thus, the present invention includes as one embodiment intended to be claimed a method of applying an electrically conductive carbon coating to a non-conductive surface, including the following steps, in any operative order:

A. providing a substrate having at least one non-conductive surface portion;

B. contacting at least the nonconductive surface portion with a conditioning agent including an amount of a cationic substantive conditioner effective to deposit a film of the conditioner on the nonconductive surface portion, thereby forming a conditioned surface;

C. contacting the conditioned surface with a carbon dispersion; and

D. fixing the electrically conductive coating on the conditioned surface by applying an aqueous acid to the electrically conductive coating.

The carbon dispersion can include electrically conductive carbon having a mean particle size no greater than about 50 microns, and a water dispersible binding agent.

Application of the carbon dispersion to the nonconductive surface portion forms a substantially continuous, electrically conductive carbon coating on the conditioned surface. The carbon and the binding agent are present in amounts effective to provide an electrically conductive coating when the composition is applied to the conditioned surface.

In alternative embodiments, the cationic substantive conditioner can be a polyamide epichlorohydrin resin. The aqueous acid can be a crosslinking agent for the water dispersible binding agent. The fixing step can be carried out after the carbon dispersion contacting step, without an intervening drying step.

In still other alternative embodiments, the carbon dispersion includes from about 1% to about 7% by weight of electrically conductive carbon. The carbon can include graphite. The graphite can have a mean particle size no greater than about 1 micron. The method can be carried out under conditions effective to provide an electrically conductive carbon coating having an electrical resistivity of less than about 1000 ohms.

In yet other alternative embodiments, the binding agent can include a polysaccharide, for example, a starch or an alkali metal carboxymethylcellulose.

In still other alternative embodiments, the electrically conductive coating can be dried on the previously nonconductive surface. The electrically conductive coating can be at most about 12 microns thick, or at most about 7 microns thick, or at most about 3 microns thick. The electrically conductive coating can be essentially free of lumpiness and voids.

In other alternative embodiments, the method further includes the step of electroplating a substantially continuous metal layer over the electrically conductive coating. The continuous metal layer can be further coated with solder, forming a soldered continuous metal layer that is substantially free of voids and pullaway.

Yet another alternative embodiment of the invention is a printed wiring board including at least two conductive circuit layers separated by nonconductive material; at least one recess in the nonconductive material defined by a nonconductive surface intersecting at least two of the conductive circuit layers; and an electrically conductive coating on the nonconductive surface. The coating can include electrically conductive carbon having a mean particle size within the range from about 0.05 to about 50 microns and a water-dispersible organic binding agent. The coating conducts electrical current between the two conductive circuit layers and accepts electroplating to provide a surface at least substantially free of visible voids.

What is claimed is:

1. A printed wiring board comprising:
   A. at least two conductive circuit layers separated by nonconductive material;
   B. at least one recess in said nonconductive material defined by a nonconductive surface intersecting at least two of said conductive circuit layers;
   C. an electrically conductive coating on said nonconductive surface, said coating including electrically conductive graphite having a mean particle size not greater than about 1 micron and a water-dispersible organic binding agent, wherein said coating is electrically conductive, allowing electrical current to flow between the two conductive circuit layers, and accepts electroplating to provide a surface at least substantially free of visible voids.

2. The printed wiring board of claim 1, having a resistivity between said conductive circuit layers of less than about 1000 ohms prior to electroplating.

3. The printed wiring board of claim 1, having a resistivity between said conductive circuit layers of less than about 600 ohms, prior to electroplating.

4. The printed wiring board of claim 1, having a resistivity between said conductive circuit layers of less than about 400 ohms, prior to electroplating.

5. The printed wiring board of claim 1, having a resistivity between said conductive circuit layers of less than about 250 ohms, prior to electroplating.

6. The printed wiring board of claim 1, having a resistivity between said conductive circuit layers of less than about 80 ohms prior to electroplating.

7. The printed wiring board of claim 1, having a resistivity of less than about 60 ohms between said conductive circuit layers, prior to electroplating.

8. The printed wiring board of claim 1, having a resistivity between said conductive circuit layers of less than about 30 ohms, prior to electroplating.

9. The printed wiring board of claim 1, having a resistivity between said conductive circuit layers of less than about 10 ohms, prior to electroplating.

10. The printed wiring board of claim 1, having a resistivity between said conductive circuit layers of less than about 2 ohms, prior to electroplating.

11. The printed wiring board of claim 1, including a multiplicity of said conductive through holes including said coating.

12. The printed wiring board of claim 1, wherein said coating is not greater than about 12 microns thick.

13. The printed wiring board of claim 1, wherein said coating is not greater than about 7 microns thick.

14. The printed wiring board of claim 1, herein said coating is not greater than about three microns thick.

15. The printed wiring board of claim 1, wherein said coating is not greater than about one micron thick.

16. The printed wiring board of claim 1, wherein said coating is free of lumpiness.

17. The printed wiring board of claim 1, wherein said water-dispersible organic binding agent is selected from the group consisting of monosaccharides, polysaccharides, and combinations thereof.

18. The printed wiring board of claim 1, further comprising an electroplated layer deposited on at least a portion of said electrically conductive coating.

19. The printed wiring board of claim 18, further comprising a solder layer deposited on at least a portion of said electroplated layer.

* * * * *